(12) United States Patent
Eskridge (10) Patent No.: US 8,505,805 B2
(45) Date of Patent: Aug. 13, 2013

(54) SYSTEMS AND METHODS FOR PLATINUM BALL BONDING

(75) Inventor: Mark Eskridge, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 444 days.

(21) Appl. No.: 12/248,687

(22) Filed: Oct. 9, 2008

(65) Prior Publication Data

US 2010/0092795 A1 Apr. 15, 2010

(51) Int. Cl.
*B23K 31/00* (2006.01)
*B23K 31/02* (2006.01)

(52) U.S. Cl.
USPC .......................... 228/180.5; 228/4.5; 228/904

(58) Field of Classification Search
USPC ........................ 228/180.5, 4.5, 904
See application file for complete search history.

(56) References Cited

U.S. PATENT DOCUMENTS

| | | |
|---|---|---|
| 5,655,700 A | 8/1997 | Pham et al. |
| 5,669,545 A | 9/1997 | Pham et al. |
| 5,783,465 A | 7/1998 | Canning et al. |
| 5,821,627 A | 10/1998 | Mori et al. |
| 6,291,897 B1 | 9/2001 | Wark et al. |
| 6,455,785 B1 | 9/2002 | Sakurai et al. |
| 6,500,760 B1 | 12/2002 | Peterson et al. |
| 6,613,662 B2 | 9/2003 | Wark et al. |
| 6,858,943 B1 | 2/2005 | Peterson et al. |
| 7,021,521 B2 | 4/2006 | Sakurai et al. |
| 7,115,495 B2 | 10/2006 | Wark et al. |
| 7,142,909 B2 | 11/2006 | Greenberg et al. |
| 7,161,250 B2 | 1/2007 | Wark et al. |
| 7,205,661 B2 | 4/2007 | Wark et al. |
| 7,211,103 B2 | 5/2007 | Greenberg et al. |
| 7,393,773 B2 | 7/2008 | Malantonio et al. |
| 2004/0188500 A1 | 9/2004 | Jacksen et al. |
| 2005/0098614 A1 | 5/2005 | Jacksen et al. |
| 2005/0189848 A1 | 9/2005 | Byers et al. |
| 2006/0091524 A1 | 5/2006 | Karashima et al. |
| 2006/0208038 A1* | 9/2006 | Wildner ...................... 228/180.5 |
| 2006/0284321 A1 | 12/2006 | Wu et al. |
| 2008/0051848 A1 | 2/2008 | Greenberg et al. |

* cited by examiner

*Primary Examiner* — Keith Walker
*Assistant Examiner* — Erin Saad
(74) *Attorney, Agent, or Firm* — Lowe Graham Jones PLLC (57) ABSTRACT

An annealed platinum free air ball is bonded to a first contact and to a second contact. The bonding work hardens the platinum so that a work hardened platinum ball is resistant to temperature induced creep.

8 Claims, 5 Drawing Sheets

SYSTEMS AND METHODS FOR PLATINUM BALL BONDING

BACKGROUND OF THE INVENTION

Ball bonding and stud bump bonding are bonding processes used to bond contact pads, traces, wire leads and/or electrical connectors to form electrical connections on semiconductor devices. Gold, copper, aluminum, and various alloys are used as metals for a ball bonding. In some situations, platinum has been used as a metal "bump" for ball bonding, stud bump bonding, or other types of semiconductor device bonding. However, platinum presents significant difficulties when used as a bump metal.

Various semiconductor-based devices are configured to detect physical events and/or cause physical events. Such devices are generally known as a Micro-Electro-Mechanical Systems (MEMS) device. For example, a MEMS gyroscope may be used to determine angular rotation and a MEMS accelerometer may be used to sense linear acceleration. The MEMS gyroscope and accelerometer measure rotation and acceleration, respectively, by measuring movement and/or forces induced in one or more proof masses mechanically coupled to and suspended from a substrate using one or more flexures. As another example, a MEMS motor may be used to induce or sense movement in a rotor.

A number of recesses etched into the substrate of the MEMS device allow selective portions of the silicon structure to move back and forth freely within an interior portion of the MEMS device. A pattern of electrical connectors, also known as metal traces, are formed on the MEMS device substrate to deliver various electrical voltages and signal outputs to and/or from the MEMS device. The MEMS device, after fabrication, may be enclosed in a protective enclosure having wire leads or connectors that provide connectivity between the outside surface of the enclosure and the metal traces of the MEMS device. Ball bonding is one method that may be used to electrically couple the wire leads or contact pads of the enclosure and the metal traces of the MEMS device.

Such MEMS devices are very sensitive to inducted stresses and/or changes in orientation of the MEMS device components. Very small changes in stress and/or orientation of the working components of the MEMs device may significantly change the signal output of the MEMS device. Accordingly, prior to use in the field, the MEMS device is calibrated. Typically, calibration of the MEMS device is performed at the factory or during a field calibration process. For example, output of a stationary MEMS gyroscope or accelerometer should be null (zero). Accordingly, during the MEMS device calibration process, the output of the stationary MEMS gyroscope and accelerometer is referenced to a null value and/or is electrically compensated to a null output.

As noted above, gold is a commonly used metal for a bump, such as a ball bond, a stud bump flip chip bond, or other semiconductor device bonds. Gold is a very ductile metal that can be plastically deformed. Further, the gold may be plastically deformed multiple times during a multi-stage bonding process. Accordingly, during a thermo compression bonding process or a thermo-ultrasonic bonding process, the ductile characteristics allow deformation of the gold bump while still providing good bonding characteristics between the gold and the wire leads or contact pads. That is, the gold easily deforms under pressure to provide a relatively large contact area with the wire leads or contact pads, and also easily electrically bonds to the wire leads or contact pads in response to the applied pressure, heat, and/or ultrasonic energy.

However, the ductility of a gold bump bond (and bump bonds made of copper, aluminum, and other alloys) has significant drawbacks when used for bonds of a MEMS device. Temperature fluctuations of the MEMS device causes a heat-induced deformation of the bump bond. Because of the ductility of the gold bump bond, such temperature-induced deformations are, at least to some extent, nonelastic. That is, after a number of temperature cycles, the deformed gold bump bond does not return to its original pre-deformation stress and/or form. Such nonelastic deformations in the gold bump bond is referred to as creep.

In the MEMS device, such nonelastic deformations in the gold bump bond may result in the MEMS device becoming uncalibrated. That is, the creep of the gold bump bond induced by temperature cycling may change the stresses at the working element of the MEMS device. In some situations, the creep of the gold bump bond induced by temperature cycling may change the position and/or orientation of the working element of the MEMS device. Accordingly, the MEMS device will become uncalibrated.

Annealed platinum metal initially exhibits very desirable ductile characteristics for a bump bonding process. However, once an annealed platinum bump has been subjected to forces that are sufficient to realign the crystal orientation of the platinum atoms, the platinum changes from an annealed material to a non-ductile material that is relatively brittle. A work hardened (also referred to as strain hardened or cold worked) platinum bump bond does not exhibit creep after temperature cycling.

However, once a platinum bump is work hardened, the platinum does not readily deform during a subsequent bonding stage. That is, the work hardened platinum does not easily deform to provide the desired relatively large contact area with the wire leads or contact pads. Further, the work hardened platinum bump does not easily electrically bond to the wire leads or contacts in response to the applied pressure, heat, and/or ultrasonic energy. Bonding of a work hardened platinum bump requires a relatively large amount of pressure, temperature, and/or ultra-sonic energy, which may damage a relatively fragile MEMS device.

Figure 1:
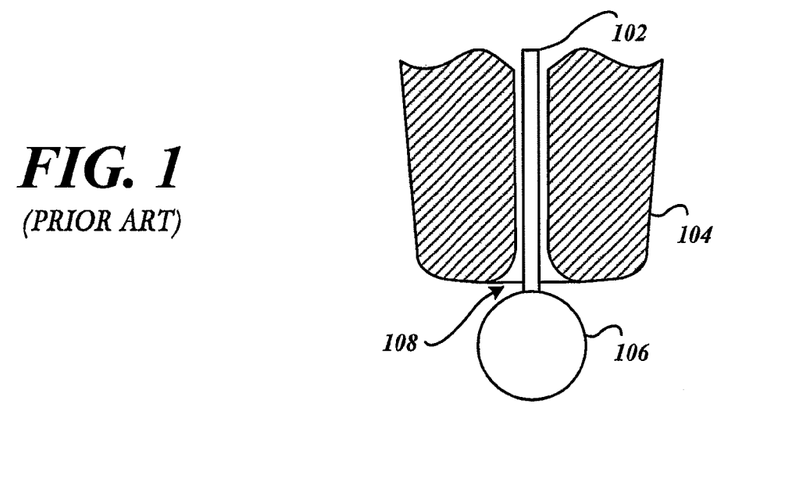
FIGS. 1-3 illustrate selected stages of a prior-art bump bonding process that uses platinum as the ball, or stud bump, material.
Figure 2:
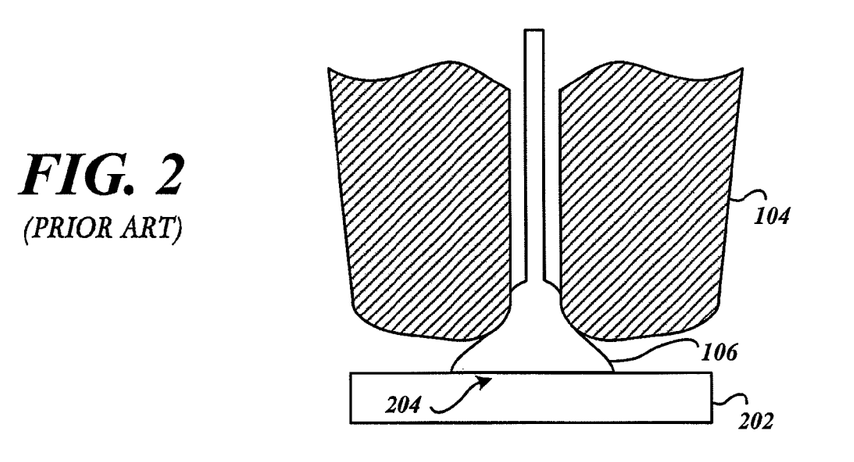
Figure 3:
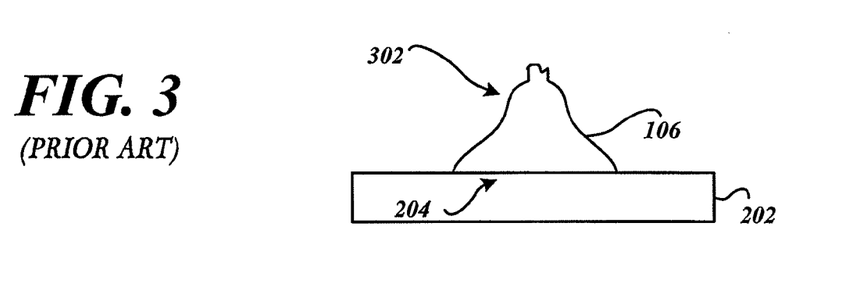

FIGS. 1-3 illustrate selected stages of a prior-art gold stud bump bonding process that uses platinum as the ball, or stud bump, metal. FIG. 1 illustrates a platinum wire 102 threaded through the capillary of a threaded capillary bond tool 104. An annealed platinum ball 106 is formed on the end of the platinum wire 102 by melting a portion of the platinum wire 102 extending out from the chamfered end 108 of the threaded capillary bond tool 104. Heat, which melts the platinum wire 102 to form the annealed platinum ball 106, may be generated by an electrical arc or by a flame.

FIG. 2 illustrates bonding of the annealed platinum ball 106 to a contact pad 202. The chamfered end 108 of the threaded capillary bond tool 104 is shaped so as to deform the annealed platinum ball 106 into a desired shape as force is exerted by the threaded capillary bond tool 104 onto the annealed platinum ball 106. Since the contact pad 202 is stationary during the bonding process, the applied force deforms the annealed platinum ball 106 into a bump. Additionally, heat and/or ultrasonic energy may be applied as the annealed platinum ball 106 is pressed against the stationary contact pad 202, thereby forming an electrical contact 204 at the juncture of the annealed platinum ball 106 and the contact pad 202.

The threaded capillary bond tool 104 is then withdrawn and the platinum wire 102 near the top 302 of the platinum ball 106 is cut or sheared off, leaving the deformed platinum ball 106 that has been bonded to the contact pad 202, as illustrated in FIG. 3. To complete the electrical connection process, such as with a stud bump flip chip bond, a lead or another contact pad must be bonded to the top 302 of the deformed platinum ball 106. However, since the applied force deforms the platinum ball 106, the deformed platinum ball 106 has become work hardened. Thus, the work hardened platinum ball is now relatively difficult to further deform and bond with a wire lead or contact pad during a subsequent bonding process.

Accordingly, the subsequent bonding process that bonds the work hardened top of the deformed platinum ball 106 with a wire lead or another contact pad requires a relatively large amount of force, heat, and/or ultrasonic energy (compared to the amount of force, heat, and/or ultrasonic energy used to bond the annealed platinum ball 106 to the contact pad 202). Alternatively, a relatively large amount of heat may be applied to the work hardened deformed platinum ball 106 to re-anneal the platinum. However, the relatively large amount of force, heat, and/or ultrasonic energy required to subsequent bonding of the top 302 of the deformed platinum ball 106 may damage a relatively fragile MEMS device.

SUMMARY OF THE INVENTION

Systems and methods of bonding contacts using an annealed platinum free air ball are disclosed. The bonding work hardens the platinum so that a work hardened platinum ball is resistant to temperature induced creep.

An exemplary embodiment has a work hardened platinum ball, a first contact bonded to the work hardened platinum ball, and a second contact bonded to the work hardened platinum ball.

In accordance with further aspects, an exemplary bonding embodiment forms an annealed platinum free air ball from a platinum metal, positions the annealed platinum free air ball between a first contact and a second contact in a predefined position, applies at least a pressure to the annealed platinum free air ball, the first contact, and the second contact to bond the annealed platinum free air ball to the first contact and the second contact, and work hardens the platinum metal in response to the applied pressure which deforms the annealed platinum free air ball, wherein the annealed platinum free air ball becomes a work hardened platinum ball.

BRIEF DESCRIPTION OF THE DRAWINGS

Preferred and alternative embodiments are described in detail below with reference to the following drawings.

DETAILED DESCRIPTION OF THE PREFERRED EMBODIMENT

Figure 4:
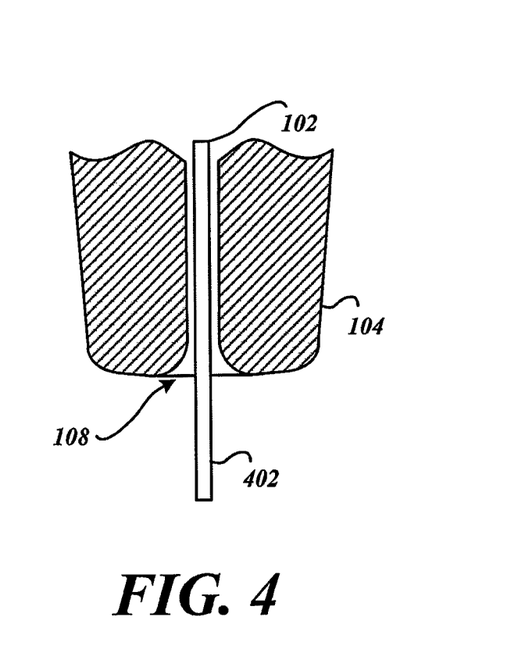
FIG. 4 illustrates a platinum wire threaded through the capillary of a threaded capillary bond tool.

FIG. 4 illustrates a platinum wire 102 threaded through the capillary of a threaded capillary bond tool 104. An end portion 402 of the platinum wire 102 extends beyond the chamfered end 108 of the threaded capillary bond tool 104. The platinum wire 102 may be pure platinum, or may be substantially made of platinum.

Figure 5:
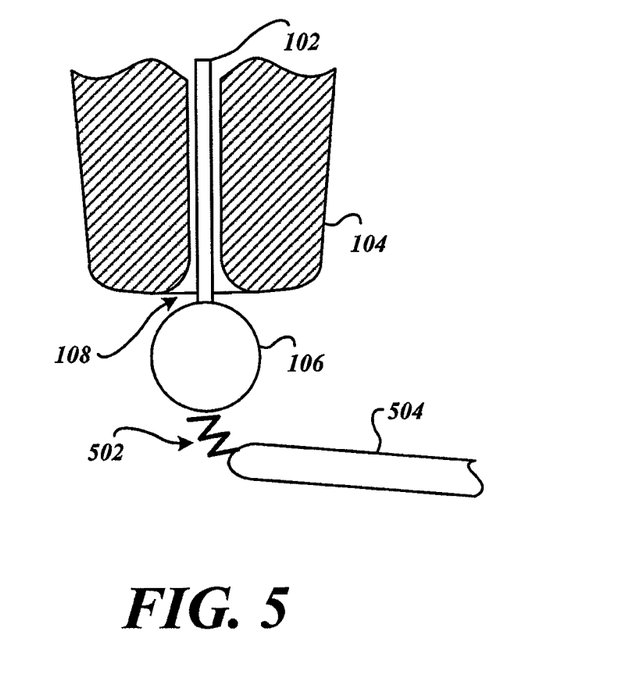
FIG. 5 illustrates an annealed platinum ball formed on the end of the platinum wire extending out from a chamfered end of the threaded capillary bond tool.

FIG. 5 illustrates formation of an annealed platinum ball 106. The annealed platinum ball 106 is formed on the end of the platinum wire 102 by melting the portion 402 (FIG. 1) of the platinum wire 102 extending out from the chamfered end 108 of the threaded capillary bond tool 104. In this example, an electrical arc 502 generates the heat which melts the end portion 402 of the platinum wire 102. The arc 502 is generated by an arcing tool 504. Since the annealed platinum ball 106 is formed by melting the end portion 402 of the platinum wire 102, the platinum is annealed. Accordingly, the annealed platinum ball 106 will readily deform under pressure and will readily bond to a electrical contact material.

Alternatively, or additionally, another source of heat may be applied to melt the end portion 402 of the platinum wire 102 to form the annealed platinum ball 106. For example, heat may be applied using a small, hot flame.

Figure 6:
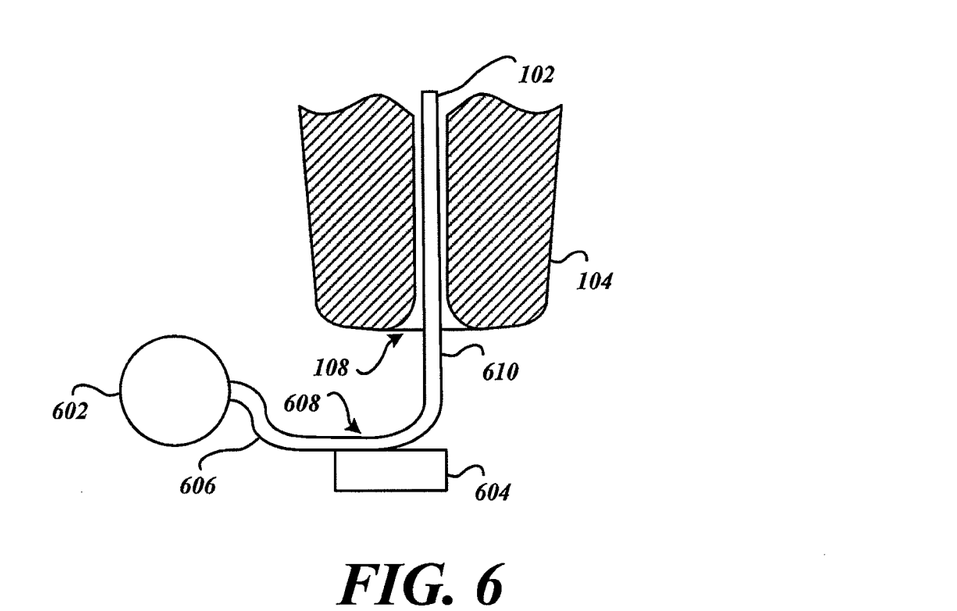
FIG. 6 illustrates an annealed platinum free air ball extending outwardly from a support.

FIG. 6 illustrates an annealed platinum free air ball 602 extending outwardly from a support 604. The annealed platinum free air ball 602 is held in a desired predefined position by a leader 606. A portion 608 is affixed to the support 604. At this stage, the portion 608 is connected to an extended portion 610 of the platinum wire 102 and is bonded to support 604.

Figure 7:
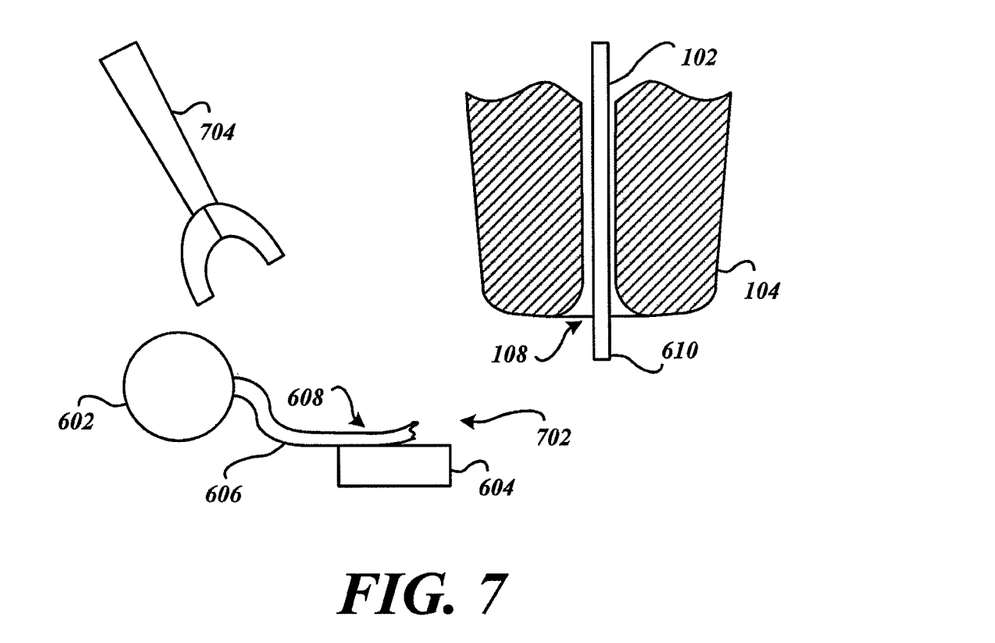
FIG. 7 illustrates separation of the platinum wire and retraction of the threaded capillary bond tool.

FIG. 7 illustrates separation of the portion 610 of the platinum wire 102, at a region 702, from the affixed portion 608. After separation, the threaded capillary bond tool 104 may be moved away from the support 604. The separation may be performed by clamping the wire above the capillary and moving the tool, or by cutting, shearing, melting, or the like. Any suitable separation means or process may be used.

The platinum wire portion 608 may be affixed to the support 604 using any suitable means or process. In one embodiment, the platinum wire portion 608 may be affixed to the support 604 with an adhesive, solder, or the like. Alternatively, the platinum wire portion 608 may be affixed to the support 604 using a physical attachment means such as by clamping, pinning, or fastening. In another embodiment, the platinum wire portion 608 may be bonded to the support 604 using force, heat, and/or ultrasonic energy.

The leader 606, formed from a portion of the platinum wire 102, extends outwardly from the support 604 such that the annealed platinum free air ball 602 is positioned and held in a desired predefined position. The position of the annealed platinum free air ball 602 is controllable by controlling the length and shape of the leader 606.

In one embodiment, after the annealed platinum free air ball 602 has been formed, the platinum wire 102 is extended to a predefined length. The leader 606 may be shaped by selectively bending the leader 606 to a predefined form.

The leader 606 may be bent before or after the platinum wire portion 608 is affixed to the support 604. The bending of the leader 606 to the predefined form may be controlled by moving the chamfered end 108 of the threaded capillary bond tool 104 to bend the platinum wire 102 to the predefined form. Alternatively, or additionally, the leader 606 may be bent by another device operable to bend the platinum wire 102. A chuck, mold, or other supported surface may be used to control the bending of the leader 606 to the predefined form. Accordingly, after the platinum wire portion 608 is affixed to the support 604 at a precisely controlled location and orientation on the support 604, the leader 606 holds the annealed platinum free air ball 602 in the predefined position.

In another embodiment, since the leader 606 is flexible and deformable, the annealed platinum free air ball 602 is moved to a precisely controlled predefined position by a suitable positioning means 704 after the platinum wire portion 608 has been affixed to the support 604. The positioning means 704 is operable to grasp the annealed platinum free air ball 602. The leader 606 bends as necessary to accommodate movement of the annealed platinum free air ball 602 into its predefined position. When the annealed platinum free air ball 602 is released from the positioning means 704, the deformed leader 606 holds its shape, thereby maintaining position of the annealed platinum free air ball 602. In one embodiment, the positioning means is a robotically controlled arm with a clamp, chuck, or the like, which is temporarily secured to the annealed platinum free air ball 602 or to a suitable location on the leader 606. In another embodiment, the positioning means is a mold or the like. Alternatively, a portion of the leader 606, preferably near the annealed platinum free air ball 602, is grasped by the positioning means 704.

Figure 8:
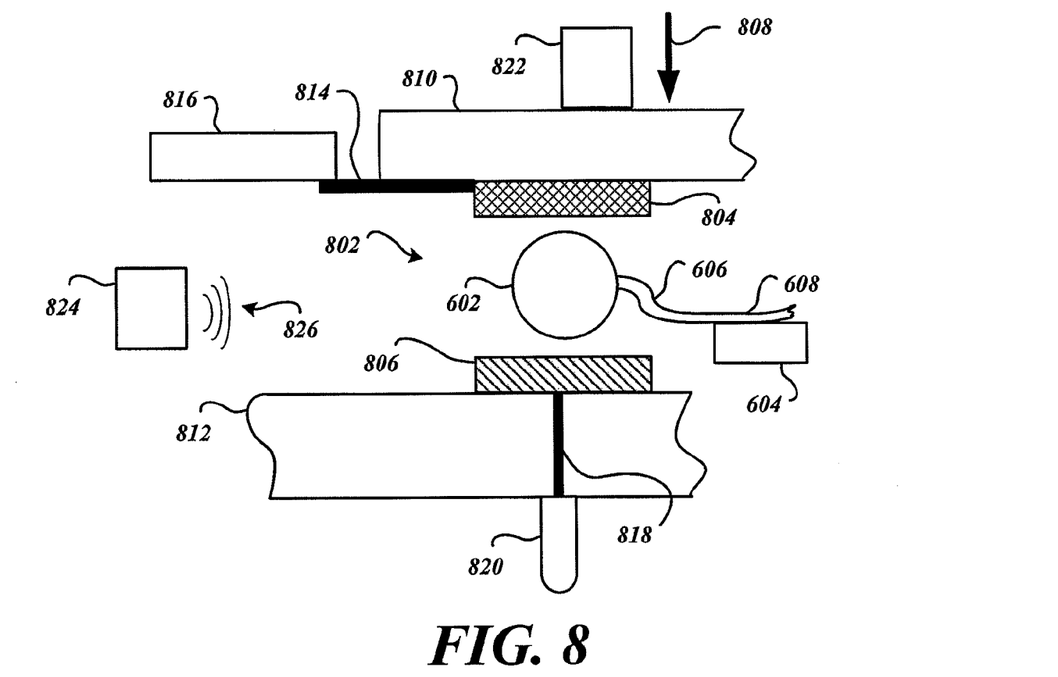
FIG. 8 illustrates the annealed platinum free air ball held in a predefined position between a first contact and a second contact prior to bonding.

FIG. 8 illustrates the annealed platinum free air ball 602 held in a predefined position 802 between a first contact 804 and a second contact 806 prior to bonding. The leader 606, affixed to the support 604, holds the annealed platinum free air ball 602 in the predefined position 802. In this simplified example, a downward force (conceptually indicated by direction arrow 808) moves the first contact 804 downwards towards the annealed platinum free air ball 602. In some processes, the leader 606 may be pre-affixed to one of the contacts 804, 806 so as to be held in position (rather than affixing the leader 602 to the support 604).

Figure 9:
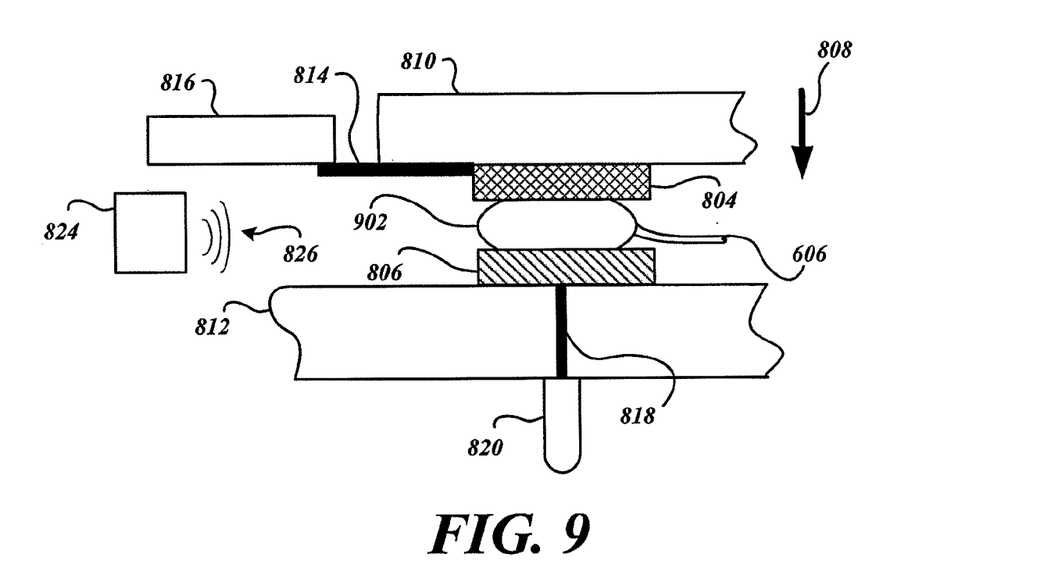
FIG. 9 illustrates the bonding of the annealed platinum free air ball to the first contact and the second first contact.

FIG. 9 illustrates the bonding of the annealed platinum free air ball 602 to the first contact 804 and the second contact 806. The applied downward force (conceptually indicated by the direction arrow 808) deforms the annealed platinum free air ball 602. The deformation work hardens the platinum ball, resulting in a work hardened platinum ball 902. The deformation of the annealed platinum free air ball 602 provides a relatively large contact area with the first contact 804 and the second contact 806. Since the annealed platinum free air ball 602 is only beginning to become work hardened as a result of the deformation, the annealed platinum free air ball 602 will readily bond to the first contact 804 and the second contact 806 in response to applied pressure, heat, and/or ultrasonic energy.

As illustrated in FIG. 9, the support 604 may be optionally removed after bonding. Additionally, all of, or a portion of, the leader 606 may be optionally removed after bonding. In other embodiment, the support 604 and/or the leader 606 are left intact. In some embodiments, the support 604 and/or the leader 606 is used to provide electrical connections to other devices if coupled to a wire, trace, or the like.

The resultant work hardened platinum ball 902 does not substantially exhibit creep that is exhibited by other bonding metals, such as gold, copper, aluminum, or other alloys. Accordingly, bonding the annealed platinum free air ball 602 to the contacts 604, 608 prior to work hardening provides an unexpected benefit of using platinum as a bonding metal that does not substantially exhibit creep. That is, the work hardened platinum ball 902 will exhibit substantially less, if any, creep during temperature cycling as compared to other bonding metals.

Further, bonding the annealed platinum free air ball 602 to both of the contacts 804 and 806 during a single bonding process obviates the need for supplemental annealing, and/or the relatively large and/or additional amounts of pressure, temperature, and/or ultra-sonic energy, during bonding processes performed after the initial work hardening of a platinum bond ball. The re-annealing of a work hardened platinum bond ball, or the additional amounts of pressure, temperature, and/or ultra-sonic energy used during subsequent bonding processes (which may otherwise damage a relatively fragile MEMS device) is avoided.

In this simplified example, the first contact 804 is affixed to a first substrate 810. A first electrical connector 814 (such as a trace, lead wire, or other suitable electrical connector) couples the first contact 804 to a MEMS device 816. Also in this simplified example, the second contact 806 is affixed to a second substrate 812. A second electrical connector 818 (such as a trace, lead wire, conductive material deposited in a via, or other suitable electrical connector) couples the second contact 806 to an electrical output element 820, such as a pin or the like. Accordingly, output from the MEMS device 816 may be communicated to the electrical output element 820, via the work hardened platinum ball 902 that has been bonded to the contacts 804, 806.

The substrates 810 and 812 conceptually correspond to any suitable structure to which the contacts 804, 806 are affixed to. For example, the first substrate 810 may correspond to a MEMS device die having one or more MEMS devices thereon. The second substrate 812 may correspond to a protective enclosure that provides electrical connectivity to the enclosed MEMS device via the electrical output element 820. As another example, the annealed platinum free air ball 602 may be used for chip-to-chip bonding.

The annealed platinum free air ball 602 is illustrated as bonding the two contacts 804, 806 during a single bonding process. In some embodiments, the annealed platinum free air ball 602 is bonded to more than two contacts.

In other embodiments, the annealed platinum free air ball 602 held in the predefined position 802 by the leader 606 is bonded to a single contact. Accordingly, the support 604 and/or the leader 606 may be separately bonded to a wire, trace, or other electrical connector. In such embodiments, after bonding, the work hardened platinum ball 902 does not substantially induce creep related problems to the device to which it is bonded to. Any other suitable bonding metal, such as gold, may be used for bonding to the support 604 and/or the leader 606. Any undesirable creep induced in the bonding metal that is bonded to the support 604 and/or the leader 606 will not induce undesirable creep effects via the work hardened platinum ball 902, which is itself substantially creep resistant.

It is appreciated that the above-described conceptual example wherein the work hardened platinum ball 902 is bonded to the first contact 804 and the second contact 806 may be representative of a flip chip bonding process wherein a device die is bonded and electrically connected to a substrate or other suitable enclosure. Accordingly, a plurality of annealed platinum free air balls 602 may be positioned in predefined positions 802 such that a die with a plurality of first contacts 804 may be bonded to a substrate or enclosure with corresponding second contacts 806.

In the various embodiments, a pressure is applied to deform the annealed platinum free air ball 602. Any suitable means 822 for applying at least a pressure to the annealed platinum free air ball, the first contact, and the second contact to bond the annealed platinum free air ball to the first contact and the second contact may be used. Further, ultrasonic energy may be used during the bonding. An suitable means 824 for applying ultrasonic energy 826 to the annealed platinum free air ball, the first contact, and the second contact may be used.

Figure 10:
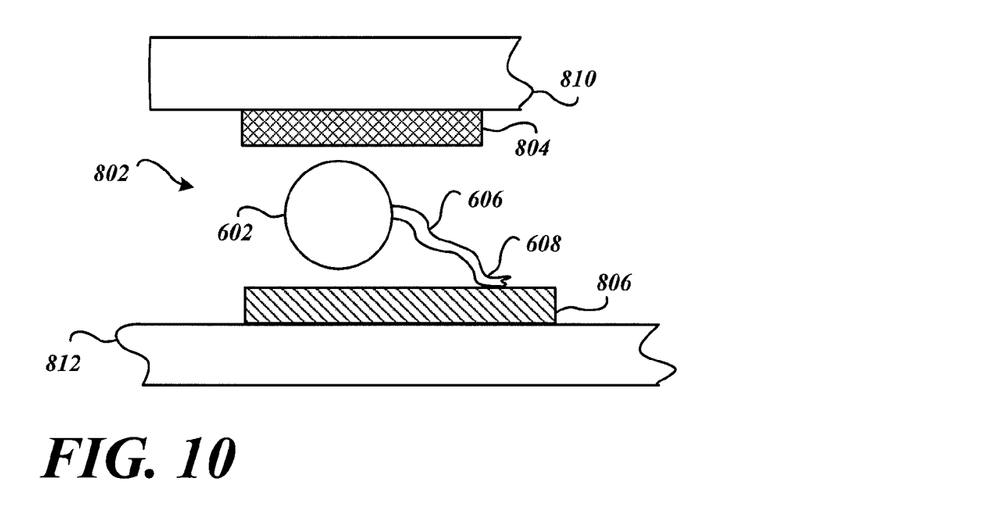
FIG. 10 illustrates bonding of the annealed platinum free air ball to a contact.

FIG. 10 illustrates the bonding of the annealed platinum free air ball 602 to the second contact 806, at portion 608. In this exemplary embodiment, the contacts 804, 804 are substantially aligned with each other. The wire leader 608 holds the annealed platinum free air ball 602 in its predefined position 802 proximate to the contacts 804, 806. Then, the annealed platinum free air ball 602 is bonded to the first contact 804 and the second contact 806.

Figure 11:
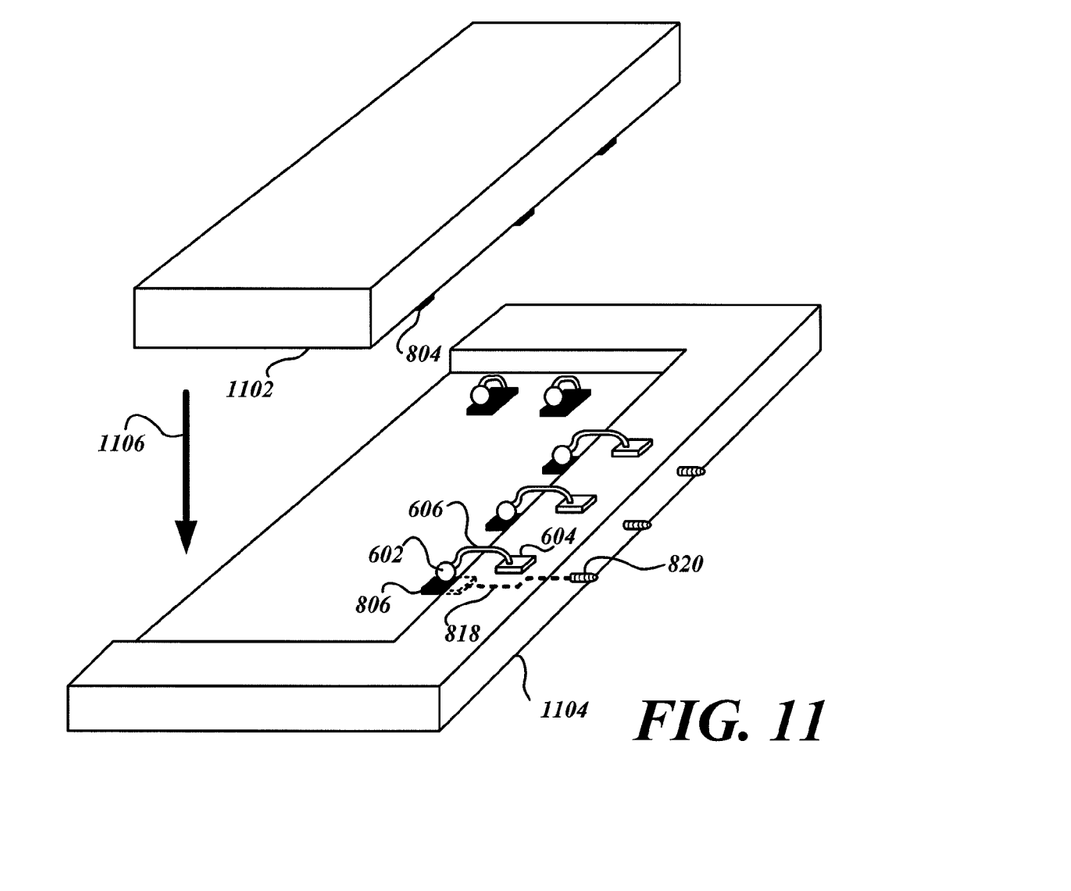
FIG. 11 illustrates a small portion of the first substrate having a plurality of first contacts, a small portion of the second substrate having a corresponding plurality of second contacts, and a corresponding plurality of annealed platinum free air balls disposed therebetween.

FIG. 11 illustrates a small portion of a MEMS device die 1102 having a plurality of first contacts 804, a small portion of a substrate 1104 having a corresponding plurality of second contacts 806, and a corresponding plurality of annealed platinum free air balls 602 disposed therebetween. Here, each of the plurality of annealed platinum free air balls 602 have been positioned in a unique predefined position between a corresponding first contact 804 and a corresponding second contact 806.

As the MEMS device die 1102 is moved in a downward direction (conceptually illustrated by the direction arrow 1106), and as pressure, heat, and/or ultrasonic energy are applied, the annealed platinum free air balls 602 bond to their corresponding contacts 804 and 806. Accordingly, the platinum metal is work hardened in response to the applied pressure, wherein each of the plurality of annealed platinum free air balls 602 become the work hardened platinum ball 902.

The above-described embodiments as illustrated in accordance with FIGS. 4-9 assumed that the first substrate 810 was moved in a downward direction (conceptually illustrated by the direction arrow 808). In alternative embodiments, the second substrate 812 may be moved in an upward direction. In other embodiments, the first substrate 810 may be moved in a downward direction and the second substrate 812 may be moved in an upward direction. Bonding forces which deform the annealed platinum free air ball 602 during the bonding process may be exerted from any suitable direction.

The above-described embodiments are conceptually described as bonding an annealed platinum free air ball 602 to contacts. Alternative embodiments are equally applicable to wedge bonding processes wherein an annealed platinum free air wedge is bonded to contacts, where the undeformed portions of the platinum wire (or wedge portion) remains in its annealed state. After bonding, the resultant work hardened platinum wedge bond is substantially resistant to creep induced by temperature cycling.

In another embodiment, a platinum "Hershey's kiss" may be bonded to a contact with a portion of annealed wire extending therefrom (resulting from retraction of the threaded capillary bond tool 104). Accordingly, a relatively short wire bond leader of annealed platinum remains affixed to the a ball as the unhardened material. The leader may then be bonded as described herein.

The above-described FIGS. 5-8 and 10-11 illustrate the annealed platinum free air ball 602 as having a spherical shape. The annealed platinum free air ball 602 may be in any shape. Further, after the annealed platinum free air ball 602 has been deformed and work hardened, thereby forming the work hardened platinum ball 902, the work hardened platinum ball 902 is understood to not be a spherical shaped "ball" bond. Rather, the deformation results in the work hardened platinum ball 902 becoming shaped much like a squashed pumpkin.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for bonding, the method comprising:
   forming an annealed platinum free air ball from a platinum metal;
   positioning the annealed platinum free air ball between a first contact and a second contact in a predefined position; and
   simultaneously applying at least a pressure to the annealed platinum free air ball, the first contact, and the second contact to bond the annealed platinum free air ball to the first contact and the second contact,
   wherein the applied pressure deforms the annealed platinum free air ball into a work hardened bump,
   wherein the first or second contacts are electrical contacts,
   wherein the annealed platinum free air ball is not deformed prior to the application of the pressure to the ball and the first and second contacts.

2. The method of claim 1, wherein the work hardened platinum ball is substantially resistant to creep induced by temperature cycling.

3. The method of claim 1, wherein positioning the annealed platinum free air ball between a first contact and a second contact comprises:
   affixing a portion of a platinum wire to a support, wherein a leader between the affixed portion and the annealed platinum free air ball holds the annealed platinum free air ball in the predefined position.

4. The method of claim 3, further comprising:
   bending the leader to a predefined form.

5. The method of claim 3, wherein positioning the annealed platinum free air ball between the first contact and the second contact further comprises:
   grasping the annealed platinum free air ball after affixing the portion of the platinum wire to the support; and
   moving the annealed platinum free air ball to the predefined position, wherein the leader bends to hold the annealed platinum free air ball in the predefined position after the annealed platinum free air ball is released.

6. The method of claim 1, further comprising:
   forming a plurality of annealed platinum free air balls from the platinum metal;
   positioning each of the plurality of annealed platinum free air balls between a corresponding first contact and a corresponding second contact, each of the plurality of annealed platinum free air balls positioned in a unique predefined position;
   applying at least the pressure to the plurality of annealed platinum free air balls, the first contacts, and the second contacts to bond the annealed platinum free air balls to the respective first contact and the respective second contact; and
   work hardening the platinum metal in response to the applied pressure, wherein each of the plurality of annealed platinum free air balls become the work hardened platinum bump.

7. The method of claim 1, wherein simultaneously applying at least a pressure comprises:
   applying ultrasonic energy to the annealed platinum free air ball, the first contact, and the second contact.

8. The method of claim 1, wherein forming the annealed platinum free air ball from the platinum metal comprises:
   melting a portion of a platinum wire to form the annealed platinum free air ball.

* * * * *